United States Patent
Suh et al.

(10) Patent No.: US 8,299,592 B2
(45) Date of Patent: Oct. 30, 2012

(54) CUBE SEMICONDUCTOR PACKAGE COMPOSED OF A PLURALITY OF STACKED TOGETHER AND INTERCONNECTED SEMICONDUCTOR CHIP MODULES

(75) Inventors: Min Suk Suh, Seoul (KR); Seung Hyun Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 185 days.

(21) Appl. No.: 12/489,626

(22) Filed: Jun. 23, 2009

(65) Prior Publication Data

US 2010/0187676 A1     Jul. 29, 2010

(30) Foreign Application Priority Data

Jan. 23, 2009 (KR) ........................ 10-2009-0006134

(51) Int. Cl.
  *H01L 23/48* (2006.01)
  *H01L 23/02* (2006.01)
  *H01L 29/40* (2006.01)
(52) U.S. Cl. .................. 257/686; 257/276; 257/777
(58) Field of Classification Search .................. 257/276, 257/686, 777
See application file for complete search history.

(56) References Cited

U.S. PATENT DOCUMENTS

| | | | | |
|---|---|---|---|---|
| 5,235,672 A * | 8/1993 | Carson | ............................ | 706/26 |
| 5,561,593 A * | 10/1996 | Rotolante | ..................... | 361/735 |
| 5,781,413 A | 7/1998 | Howell et al. | | |
| 5,847,448 A | 12/1998 | Val et al. | | |
| 6,008,530 A * | 12/1999 | Kano | ............................. | 257/686 |
| 6,034,438 A * | 3/2000 | Petersen | ....................... | 257/786 |
| 6,380,616 B1 * | 4/2002 | Tutsch et al. | ................... | 257/686 |
| 6,451,624 B1 * | 9/2002 | Farnworth et al. | ............ | 438/106 |
| 6,472,746 B2 | 10/2002 | Taniguchi et al. | | |
| 6,611,052 B2 * | 8/2003 | Poo et al. | ....................... | 257/686 |
| 6,747,347 B2 | 6/2004 | Farrar et al. | | |
| 6,861,287 B2 | 3/2005 | Farrar et al. | | |
| 7,420,262 B2 * | 9/2008 | Bauer et al. | .................... | 257/620 |
| 7,465,608 B1 * | 12/2008 | Farrar | ........................... | 438/107 |
| 7,531,890 B2 * | 5/2009 | Kim | ............................... | 257/621 |
| 7,732,328 B2 * | 6/2010 | Kwon et al. | ................... | 438/667 |
| 7,767,494 B2 * | 8/2010 | Sasaki et al. | .................. | 438/109 |
| 7,829,998 B2 * | 11/2010 | Do et al. | ......................... | 257/698 |
| 7,928,549 B2 * | 4/2011 | Chen et al. | ..................... | 257/686 |

(Continued)

FOREIGN PATENT DOCUMENTS

KR    1998-0024039 B1    7/1998

(Continued)

*Primary Examiner* — James Mitchell
(74) *Attorney, Agent, or Firm* — Ladas & Parry LLP (57) ABSTRACT

A cube semiconductor package includes one or more stacked together and interconnected semiconductor chip modules. The cube semiconductor package includes a semiconductor chip module and connection members. The semiconductor chip module includes a semiconductor chip which has a first and second surface, side surfaces, bonding pads, through-electrodes and redistribution lines. The second surface faces away from the first surface. The side surfaces connect to the first and second surfaces. The bonding pads are placed on the first surface. The through-electrodes pass through the first and second surfaces. The redistribution lines are placed at least on one of the first and second surfaces and are electrically connected to the through-electrodes and the bonding pads, and have ends flush with the side surfaces. The connection members are placed on the side surfaces and electrically connected with the ends of the redistribution lines.

20 Claims, 3 Drawing Sheets

U.S. PATENT DOCUMENTS

| | | | |
|---|---|---|---|
| 2002/0126459 A1* | 9/2002 | Albert et al. | 361/743 |
| 2002/0131252 A1 | 9/2002 | Hall et al. | |
| 2003/0003705 A1* | 1/2003 | Chung et al. | 438/612 |
| 2007/0023883 A1 | 2/2007 | Brunnbauer et al. | |
| 2008/0036082 A1* | 2/2008 | Eun | 257/737 |
| 2008/0105984 A1* | 5/2008 | Lee | 257/777 |
| 2008/0311701 A1* | 12/2008 | Yang | 438/108 |
| 2008/0315388 A1* | 12/2008 | Periaman et al. | 257/690 |
| 2009/0014891 A1 | 1/2009 | Chang et al. | |

FOREIGN PATENT DOCUMENTS

| | | | |
|---|---|---|---|
| KR | 1999-0030671 Y1 | 7/1999 | |

* cited by examiner

CUBE SEMICONDUCTOR PACKAGE COMPOSED OF A PLURALITY OF STACKED TOGETHER AND INTERCONNECTED SEMICONDUCTOR CHIP MODULES

CROSS-REFERENCE TO RELATED APPLICATIONS

The present application claims priority to Korean patent application number 10-2009-0006134 filed on Jan. 23, 2009, which is incorporated herein by reference in its entirety.

BACKGROUND OF THE INVENTION

The present invention relates to a cube semiconductor package including a plurality of semiconductor packages which are connected in a cube type so as to increase data storage capacity and data processing speed.

Semiconductor chips are capable of storing a huge amount of data and processing the data rapidly. Applications of semiconductor packages are generally used in information processing units such as in computers and function to store and process data.

Recently efforts have been made to provide stacked semiconductor packages that have at least two semiconductor packages stacked together which are mounted onto a printed circuit board so as to increase data storage capacity and data processing speeds.

Unfortunately in such stacked semiconductor packages that have a number of the semiconductor packages stacked upon one another, the thickness of the stacked semiconductor package markedly increases. As the thickness of the stacked semiconductor package increases, the lengths of signal transmission path vary which makes processing data at relatively high speeds very difficult.

SUMMARY OF THE INVENTION

Embodiments of the present invention are include a cube semiconductor package in which semiconductor packages are electrically connected with one another in a cube type configuration or like a block assembly so that data storage capacity and data processing speed can be increased.

In one aspect of the present invention, a cube semiconductor package comprises a semiconductor chip module including a semiconductor chip which has a first surface, a second surface facing away from the first surface, side surfaces connecting the first and second surfaces and bonding pads placed on the first surface, through-electrodes which pass through the first and second surfaces, and redistribution lines which are placed at least one of the first and second surfaces, are electrically connected with the through-electrodes and the bonding pads, and have ends flush with the side surfaces; and connection members placed on the side surfaces and electrically connected with the ends of the redistribution lines.

The redistribution lines have extension parts which extend from the first surface to the side surfaces.

The connection members comprise conductive balls.

The cube semiconductor package may further comprise an adhesive member covering the redistribution lines and having openings which expose the through-electrodes.

At least two semiconductor chip modules are stacked in a first direction and are electrically connected with each other by the through-electrodes.

Conductive balls are connected to ends of the through-electrodes of at least one of an upper semiconductor chip module and a lower semiconductor chip module in the semiconductor chip modules.

The semiconductor chip modules may have the same size and the same shape.

The semiconductor chip modules may include first semiconductor chip modules having a first size and second semiconductor chip modules having a second size smaller than the first size, and the side surfaces of the first and second semiconductor chip modules are flush with each other.

The cube semiconductor package further comprises an additional semiconductor chip module having a semiconductor chip which is placed on at least one of the side surfaces of the semiconductor chip module in a second direction perpendicular to the first direction and has bonding pads, and through-electrodes which pass through the semiconductor chip placed in the second direction and are electrically connected with the bonding pads and the connection members.

At least two additional semiconductor chip modules are stacked, and the through-electrodes of the additional semiconductor chip modules are electrically connected with each other.

The additional semiconductor chip modules include a data storage semiconductor chip for storing data and a data processing semiconductor chip for processing data.

At least two additional semiconductor chip modules are provided and may have the same size and the same shape.

At least two additional semiconductor chip modules are provided and may have different sizes.

Connection members are connected to ends of the through-electrodes of the additional semiconductor chip modules, which are exposed to the outside.

The cube semiconductor package may further comprises gap-fill members interposed between the semiconductor chip modules and the additional semiconductor chip modules.

The redistribution lines may be formed of a conductive material, preferably a first metal which has a first hardness and a first melting temperature. The connection members, which are placed on the side surfaces of the semiconductor chip, may be formed of a conductive material, preferably a second metal which has a second hardness less than the first hardness and a second melting temperature lower than the first melting temperature.

The first metal may preferably comprise copper, and the second metal preferably comprise solder.

DESCRIPTION OF SPECIFIC EMBODIMENTS

Figure 1:
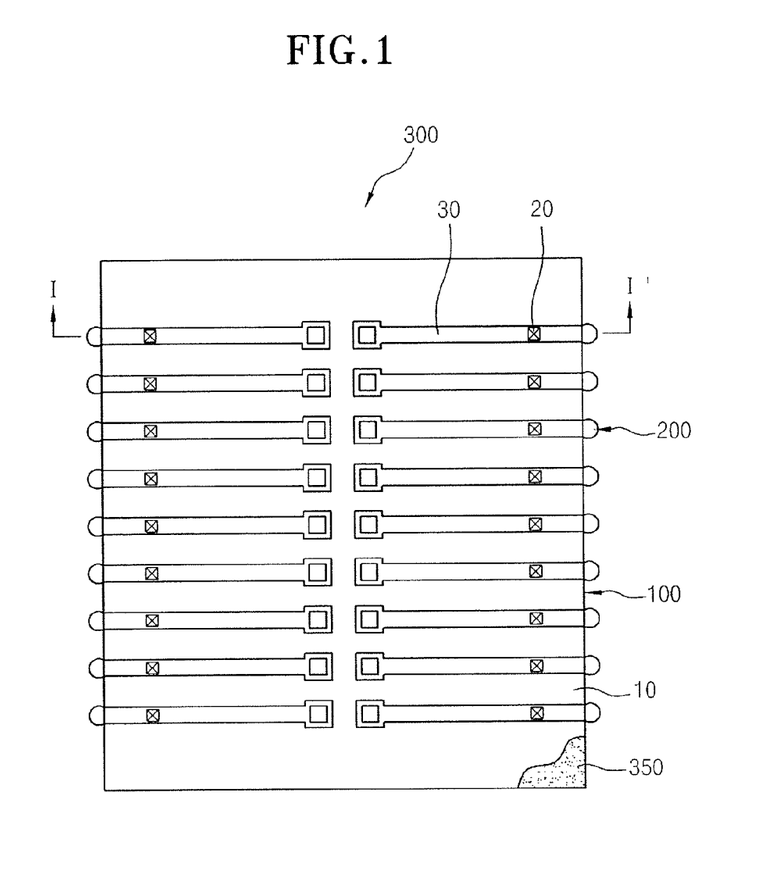
FIG. 1 is a plan view showing a cube semiconductor package in accordance with a first embodiment of the present invention.
Figure 2:
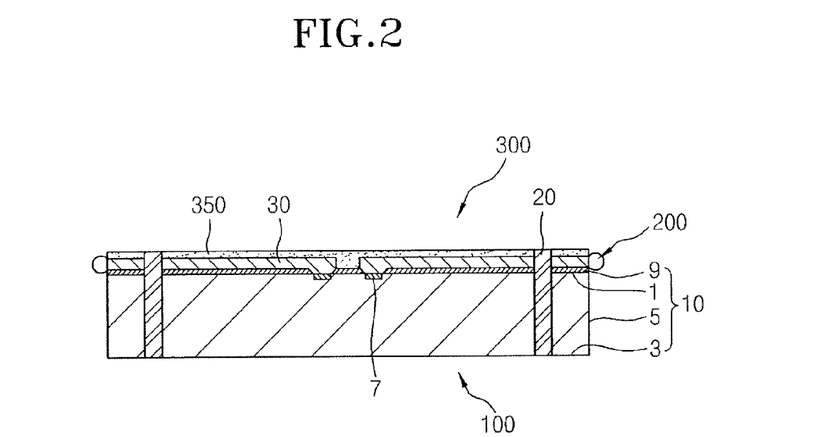
FIG. 2 is a cross-sectional view taken along the line I-I' of FIG. 1.

FIG. 1 is a plan view showing a cube semiconductor package in accordance with a first embodiment of the present invention. FIG. 2 is a cross-sectional view taken along the line I-I' of FIG. 1.

Referring to FIGS. 1 and 2, a cube semiconductor package 300 according to an embodiment of the present invention is shown including a semiconductor chip module 100 and connection members 200. The cube semiconductor package 300 may further include an adhesive member 350.

The semiconductor chip module 100 shown in FIG. 1 also includes a semiconductor chip 10, through-electrodes 20, and redistribution lines 30.

The semiconductor chip 10 is depicted as having a rectangular hexahedron shape in FIGS. 1-2, although it will be understood by one skilled in the art that the semiconductor chip may have any known geometrical shape. As shown in FIG. 2, the semiconductor chip 10 is depicted having the shape of a rectangular hexahedron including a first surface 1, a second surface 3, side surfaces 5, and bonding pads 7. In addition, the semiconductor chip 10 is may also include an insulation layer 9. A circuit section (not shown) is formed in the semiconductor chip 10. The circuit section can include any known circuit section such as a data storage unit (not shown) for storing data and/or a data processing unit (not shown) for processing data.

The first surface 1 and the second surface 3 of the semiconductor chip 10 are shown facing opposite away from each other. The side surfaces 5 of the semiconductor chip 10 are shown meeting or adjoining the first and second surfaces 1 and 3. The bonding pads 7 are shown disposed on the first surface 1. The bonding pads 7 are shown arranged in two substantially linear rows along a central portion of the first surface 1, although it will be understood by one having skill in the art that the bonding pads 7 could be arranged in other configurations as well. The respective bonding pads 7 are electrically connected with the circuit section (not shown) formed in the semiconductor chip 10.

The insulation layer 9 is shown disposed on portions of the first surface 1 of the semiconductor chip 10 such that the bonding pads 7 are exposed to the outside through the insulation layer 9 via redistribution lines 30.

The redistribution lines 30 are disposed on the insulation layer 9. The redistribution lines 30 may be made of any conductive material which has a first hardness and a first melting temperature, for example copper or a copper alloy. The redistribution lines 30 are shown formed on the insulation layer 9 in the form of lines, although it should be understood that this is by way of example only, and the redistribution lines 30 may be disposed in any number of other shapes or configurations. A first end of each redistribution line 30 is electrically connected to a respective bonding pad 7 and a second end of each of the redistribution lines 30, opposite the first end, is shown to terminate flush with the side surfaces 5 of the semiconductor chip 10.

In the present embodiment, the redistribution lines 30 can be made of any known conductive material as long as the ends of the redistribution lines 30 can be formed flush with the side surfaces 5 of the semiconductor chip 10. For example, the redistribution lines 30 may be formed of copper, nickel or gold. The redistribution lines 30 including at least one of nickel and gold significantly enhance the adhesion force between the connection members 200 and the redistribution lines 30 so that the connection members 200 either are inhibited or are prevented from being released from the redistribution lines 30.

According to an embodiment of the present invention, the second ends of the respective redistribution lines 30 can extend to at least one of the plurality of side surfaces 5 of the semiconductor chip 10. For example, when the semiconductor chip 10 has four side surfaces 5, the second ends of the redistribution lines 30 can be flush with at least one of the side surfaces 5 or up to all four side surfaces 5 of the semiconductor chip 10.

As shown in FIG. 2, the adhesive member 350 is disposed over the insulation layer 9. The adhesive member 350 covers and electrically insulates the redistribution lines 30 disposed on the insulation layer 9. The adhesive member 350 can comprise an adhesive substance or a double-sided adhesive tape.

As shown in FIG. 2, the through-electrodes 20 pass through the adhesive member 350, the redistribution lines 30, the insulation layer 9, and the first and second surfaces 1 and 3 of the semiconductor chip 10. According to an embodiment of the present invention, the through-electrodes 20 may have column shapes and can be formed of a conductive material, for example copper and other metals. In the present embodiment, the through-electrodes 20 are configured to pass through and be electrically coupled with the redistribution lines 30.

The connection members 200 can be placed anywhere on the semiconductor chip module 100 as long as the connection members are electrically coupled with their respective redistribution lines 30. Preferably the connection members 20 are placed on the side surfaces 5 of the semiconductor chip 10. Preferably the connection members 200 are electrically coupled with the second ends of the redistribution lines 30 which are flush with the side surfaces 5 of the semiconductor chip 10. As shown in FIG. 2, the connection members 200 may be spherical connection members, although other shapes are possible. In the present embodiment, the connection members 200 can comprise, for example, solder balls which contain solder having a second hardness which is less than the first hardness and having a second melting temperature which is lower than the first melting temperature.

Figure 3:
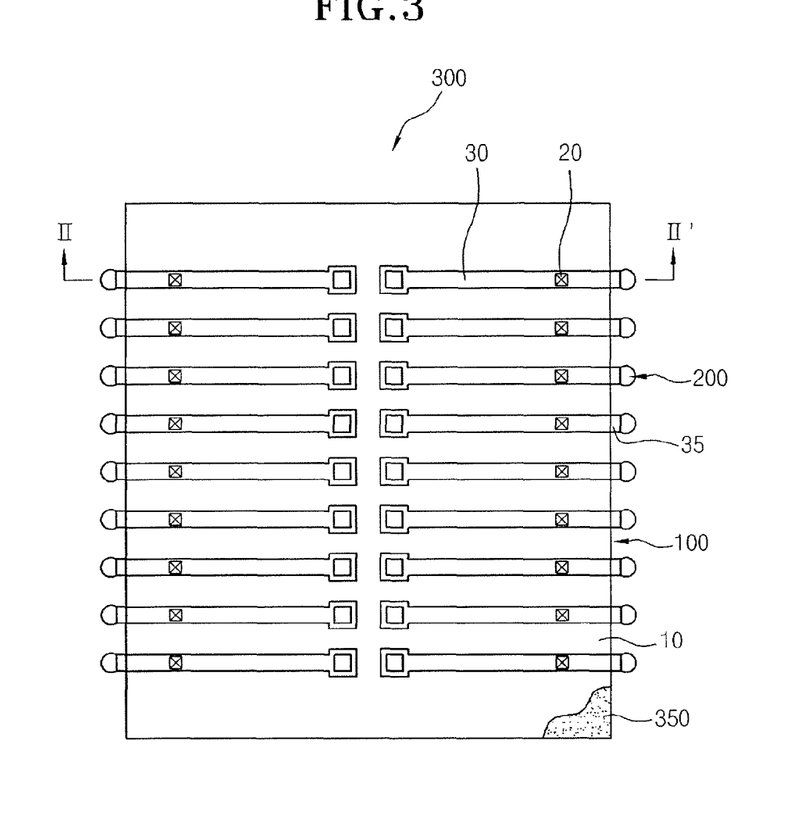
FIG. 3 is a plan view showing a cube semiconductor package in accordance with a second embodiment of the present invention.
Figure 4:
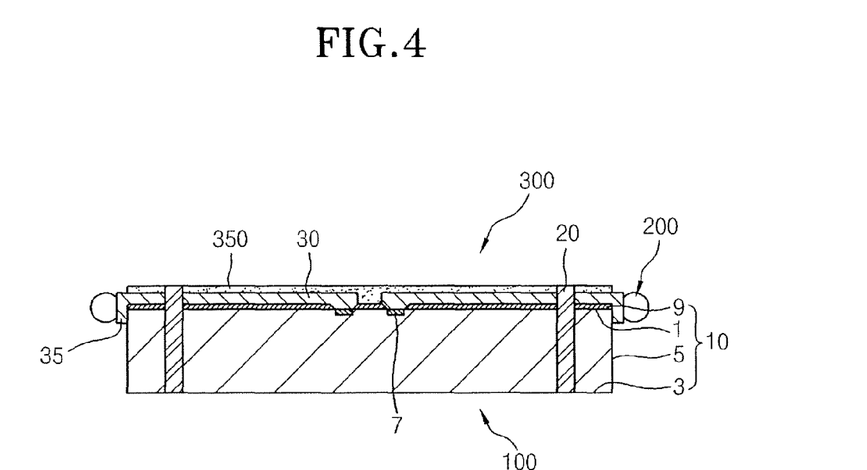
FIG. 4 is a cross-sectional view taken along the line II-II' of FIG. 3.

FIG. 3 is a plan view showing a cube semiconductor package in accordance with a second embodiment of the present invention. FIG. 4 is a cross-sectional view taken along the line II-II' of FIG. 3. The cube semiconductor package 300 according to the embodiment shown in FIGS. 3 and 4, is substantially the same as the cube semiconductor package 300 described and depicted as above with reference to FIGS. 1 and 2 except for the redistribution lines. As such, same elements are identified with same reference numerals, and detailed description thereof is omitted.

Referring now to FIGS. 3 and 4, in order to increase the contact area between the connection members 200 and the redistribution lines 30, the redistribution lines 30 can be equipped to have optional extension parts 35. As before, the first ends of the redistribution lines 30 are electrically coupled with the bonding pads 7. The extension parts 35 extend from the first surface 1 to the side surfaces 5 of the semiconductor chip 10. That is to say, the redistribution lines 30 have an 'L'-shaped section as depicted in FIG. 4, due to the presence of the extension parts 35.

A nickel layer and/or a gold layer (not shown) can be formed on the surfaces of the extension parts 35 of the redistribution lines 30, and the connection members 200 having a spherical shape can be placed on the extension parts 35. The connection members 200 can contain solder. As described above, the spherical shape of the connection members 200 is by way of example only, and the present invention is not limited hereto.

In the presently depicted embodiment, due to the fact that the extension parts 35 of the redistribution lines 30 are formed on the side surfaces 5 of the semiconductor chip 10, the contact area between the connection members 200 and the redistribution lines 30 can be increased, such that the connection members 200 are prevented or at least inhibited from being released from the redistribution lines 30.

Figure 5:
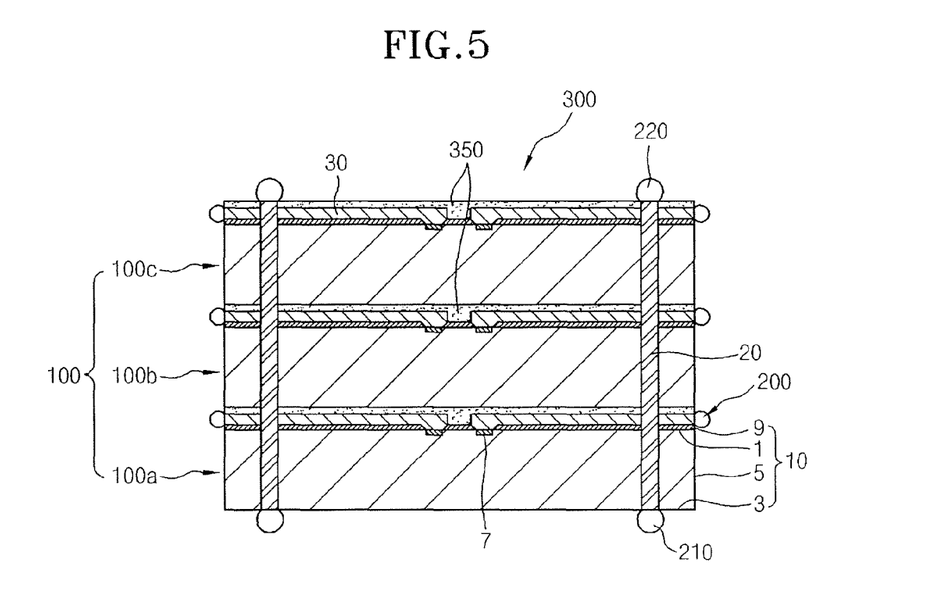
FIG. 5 is a cross-sectional view showing a cube semiconductor package in accordance with a third embodiment of the present invention.

FIG. 5 is a cross-sectional view showing a cube semiconductor package in accordance with a third embodiment of the present invention. In the present embodiment, each of semiconductor chip modules 100a, 100b, and 100c of the cube semiconductor package 300 includes component parts which are substantially the same as those of the semiconductor chip module 100 illustrated in FIGS. 1 and 2. Accordingly, repeated explanation for substantially the same component parts will be omitted herein, and the same terms and the same reference numerals will be used to refer to the same component parts.

Referring to FIG. 5, a cube semiconductor package 300 includes a plurality of semiconductor chip modules 100a, 100b, and 100c, and connection members 200, 210, and 220.

In the presently depicted embodiment, the cube semiconductor package 300 is shown as including three semiconductor modules 100a, 100b, and 100c, although it should be understood by one having skill in the art that according to embodiments of the present invention the cube semiconductor package 300 may include any number of semiconductor chip modules. Here, the three semiconductor chip modules will be defined as a first semiconductor chip module 100a, a second semiconductor chip module 200b, and a third semiconductor chip module 100c.

As shown in FIG. 5, the second semiconductor chip module 100b is disposed on the first semiconductor chip module 100a, and the third semiconductor chip module 100c is disposed on the second semiconductor chip module 100b.

Each of the first through third semiconductor chip modules 100a, 100b, and 100c includes a semiconductor chip 10, through-electrodes 20, and redistribution lines 30.

The semiconductor chip 10 of each of the first through third semiconductor chip modules 100a, 100b, and 100c has the shape of a rectangular hexahedron, although it should be understood that the present invention is not limited in this way, and a semiconductor chip 10 may have any of a number of shapes. The semiconductor chip 10 includes a first surface 1, a second surface 3, side surfaces 5, and bonding pads 7. In addition, the semiconductor chip 10 can further include an insulation layer 9. A circuit section (not shown) is formed in the semiconductor chip 10.

The circuit section can include a data storage unit (not shown) for storing data and a data processing unit (not shown) for processing data.

The first surface 1 and the second surface 3 of the semiconductor chip 10 face substantially away from each other, and the side surfaces 5 of the semiconductor chip 10 adjoin the first and second surfaces 1 and 3. The bonding pads 7 are disposed on the first surface 1 of the semiconductor chip 10. As shown in FIG. 5, the bonding pads 7 may be arranged in two rows along a middle portion of the first surface 1, although other configurations are considered possible according to the present invention. The respective bonding pads 7 are electrically coupled with the circuit section formed in the semiconductor chip 10.

In the presently depicted embodiment, the semiconductor chips 10 of the first through third semiconductor chip modules 100a, 100b and 100c may include the same type of semiconductor chips performing the same function, or alternately, the semiconductor chips 10 of the first through third semiconductor chip modules 100a, 100b, and 100c may include different types of semiconductor chips performing different functions.

In the present embodiment, the semiconductor chips 10 of the first through third semiconductor chip modules 100a, 100b, and 100c may be the same size, or alternately the semiconductor chips 10 of the first through third semiconductor chip modules 100a, 100b and 100c may be of different sizes.

As shown in FIG. 5, the insulation layer 9 may be disposed on portions of the first surface 1 of the semiconductor chip 10 such that the bonding pads 7 are exposed to the outside through the insulation layer 9.

The redistribution lines 30 are shown placed on the insulation layer 9. The redistribution lines 30 comprise an electrically conductive material, preferably copper or a copper alloy. As shown in FIG. 5, the redistribution lines 30 may be formed on the insulation layer 9 in the form of lines, although it should be understood that the line shape is by way of example only, and other shapes and configurations of the redistribution lines 30 are considered possible according to embodiments of the present invention. First ends of the redistribution lines 30 are electrically connected with the respective bonding pads 7, and second ends of the redistribution lines 30, opposite the first ends, are formed to terminate flush with the side surfaces 5 of the semiconductor chip 10.

In the present embodiment, the redistribution lines 30 can be formed of, for example, any electrically conductive material, preferably copper or an alloy. Further a nickel layer and/or a gold layer (not shown) may be formed on the second ends of the redistribution lines 30 which are flush with the side surfaces 5 of the semiconductor chip 10. The nickel layer and/or the gold layer significantly enhance the adhesion force between the connection members 200 and the redistribution lines 30 so that the connection members 200 are prevented from being released from the redistribution lines 30.

In the presently depicted embodiment, the second ends of the respective redistribution lines 30 extend to at least one of the plurality of side surfaces 5 of the semiconductor chip 10, however the redistribution lines may extend to as many side surfaces as exist on the semiconductor chip. For example, when the semiconductor chip 10 has four side surfaces 5, the second ends of the redistribution lines 30 can be flush with only one side surface and up to as four side surfaces 5 of the semiconductor chip 10.

In the present embodiment, the redistribution lines 30 may also include extension parts extend from the first surface 1 to the side surfaces 5, such as shown in FIG. 4. The extension parts increase the contact area between the redistribution lines 30 and the connection members 200 which will be described later in detail.

As shown in FIG. 5, an adhesive member 350 is disposed over the insulation layer 9. The adhesive member 350 covers and insulates the redistribution lines 30 placed on the insulation layer 9. The adhesive member 350 can comprise, for example, an adhesive layer containing an adhesive substance or a double-sided adhesive tape.

Adhesive members 350 are shown respectively interposed between the first semiconductor chip module 100a and the second semiconductor chip module 100b and between the second semiconductor chip module 100b and the third semiconductor chip module 100c. Another adhesive member 350 is disposed on the first surface 1 of the semiconductor chip 10 of the third semiconductor chip module 100c. The adhesive members 350 function to physically fasten the first through third semiconductor chip modules 100a, 100b, and 100c.

The through-electrodes 20 pass through the first through third semiconductor chip modules 100a, 100b and 100c. In the present embodiment, the through-electrodes 20 are electrically coupled with the respective redistribution lines 30 of the first through third semiconductor chip modules 100a, 100b, and 100c. In the present embodiment, the length of the through-electrodes 20 can correspond to the total thickness of the first through third semiconductor chip modules 100a, 100b, and 100c.

The connection members 210 and 220 for through-electrodes can be electrically coupled with both ends of the through-electrodes 20, and additional semiconductor packages (not shown) can be electrically connected to the cube semiconductor package 300 using the connection members 210 and 220 for through-electrodes.

The connection members 200 are shown formed on the side surfaces 5 of the first through third semiconductor chip modules 100a, 100b and 100c. The connection members 200 are electrically coupled with the second ends of the redistribution lines 30 which are flush with the side surfaces 5 of the first through third semiconductor chip modules 100a, 100b, and 100c. In the present illustrative embodiment, the connection members 200 can be spherical connection members. In the present illustrative embodiment, the connection members 200 can comprise, for example, solder balls which contain solder, although it should be understood that the connection members 200 may be formed of other materials in other shapes according to the present invention.

Figure 6:
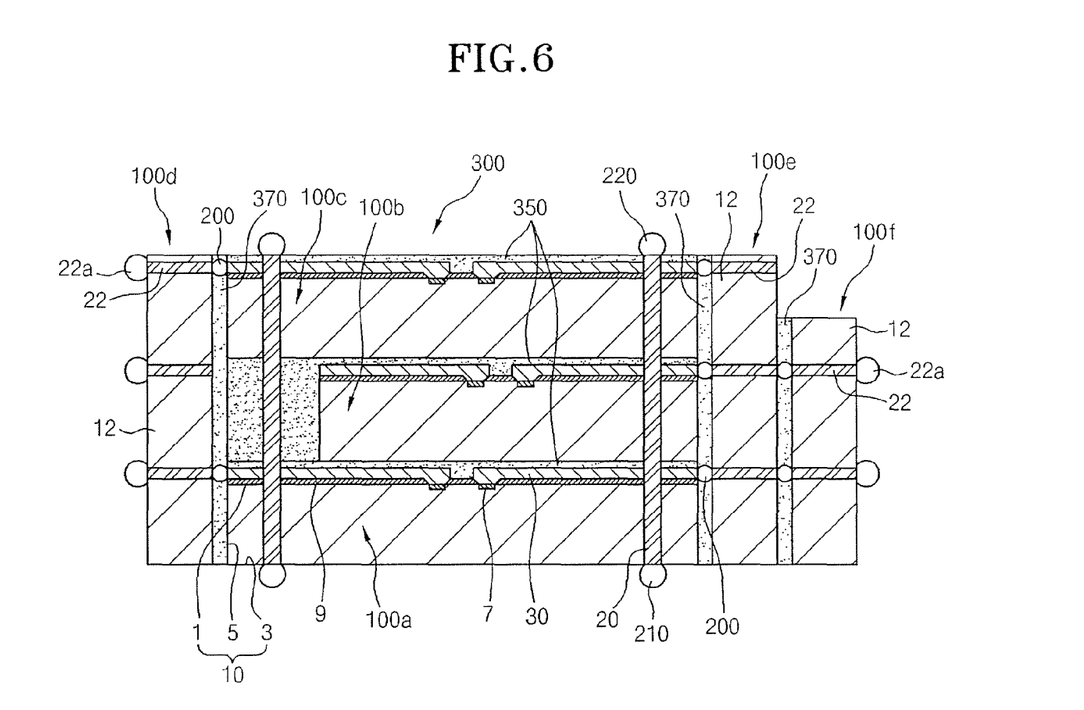
FIG. 6 is a plan view showing a cube semiconductor package in accordance with a fourth embodiment of the present invention.

FIG. 6 is a plan view showing a cube semiconductor package in accordance with a fourth embodiment of the present invention.

Referring to FIG. 6, a cube semiconductor package 300 is shown to include a plurality of horizontal semiconductor chip modules 100a, 100b, and 100c, a plurality of vertical semiconductor chip modules 100d, 100e, and 100f, and connection members 200, 210 and 220.

The present embodiment shows a cube semiconductor package 300 having three horizontal semiconductor chip modules 100a, 100b, and 100c and three vertical semiconductor chip modules 100d, 100e, and 100f, although it should be understood that this is by way of example only, and the present invention is in no way limited in this way. The three horizontal semiconductor chip modules are defined as a first horizontal semiconductor chip module 100a, a second horizontal semiconductor chip module 100b, and a third horizontal semiconductor chip module 100c. Also, the three vertical semiconductor chip modules are defined as a first vertical semiconductor chip module 100d, a second vertical semiconductor chip module 100e, and a third vertical semiconductor chip module 100f.

The second horizontal semiconductor chip module 100b is shown placed on the first horizontal semiconductor chip module 100a, and the third horizontal semiconductor chip module 100c is shown placed on the second horizontal semiconductor chip module 100b.

Each of the first through third horizontal semiconductor is chip modules 100a, 100b, and 100c includes a semiconductor chip 10, through-electrodes 20, and redistribution lines 30.

The semiconductor chip 10 of each of the first through third horizontal semiconductor chip modules 100a, 100b, and 100c may have the any geometric shape, for example and preferably, a rectangular hexahedron. The semiconductor chip 10 includes a first surface 1, a second surface 3, side surfaces 5, and bonding pads 7. In addition, the semiconductor chip 10 may further include an insulation layer 9. A circuit section (not shown) is formed in the semiconductor chip 10 of each of the first through third horizontal semiconductor chip modules 100a, 100b, and 100c. The circuit section may provide any number of circuit functions such as including a data storage unit (not shown) for storing data and a data processing unit (not shown) for processing data.

The first surface 1 and the second surface 3 of the semiconductor chip 10 are face opposite each other, and the side surfaces 5 of the semiconductor chip 10 are shown adjoining together the first and second surfaces 1 and 3. The bonding pads 7 are placed on the first surface 1. The bonding pads 7 can be arranged in two rows on the middle portion of the first surface 1. The respective bonding pads 7 are electrically coupled with the circuit section (not shown) formed in the semiconductor chip 10.

In the present embodiment, the semiconductor chips 10 of the first through third horizontal semiconductor chip modules 100a, 100b, and 100c can comprise the same type of semiconductor chips which perform the same function, or alternately, the semiconductor chips 10 of the first through third horizontal semiconductor chip modules 100a, 100b, and 100c can comprise any number of different types of semiconductor chips which perform different functions.

In the present embodiment, the semiconductor chips 10 of the first through third horizontal semiconductor chip modules 100a, 100b, and 100c may each have the same size and shape, or alternately, the semiconductor chips 10 of the first through third horizontal semiconductor chip modules 100a, 100b, and 100c may have one or more different sizes and shapes.

The insulation layer 9 is disposed on a portion of the first surface 1 of the semiconductor chip 10 such that the bonding pads 7 are exposed to the outside through the insulation layer 9.

The redistribution lines 30 are placed on the insulation layer 9 and can be made of any conductive material, for example and preferably copper or a copper alloy. The redistribution lines 30 are formed on the insulation layer 9 in the form of lines, although it should be understood that other configurations of the redistribution lines are possible according to embodiments of the present invention. The first ends of the redistribution lines 30 are electrically coupled to respective bonding pads 7, and the second ends of the redistribution lines 30, which face away from the first ends, are substantially flush with the side surfaces 5 of the semiconductor chip 10.

In the present embodiment, the redistribution lines 30 can be made of, for example, copper, and a nickel layer and/or a gold layer (not shown) can be formed on the second ends of the redistribution lines 30, which are flush with the side surfaces 5 of the semiconductor chip 10. The nickel layer and/or the gold layer (not shown) are noted to significantly enhance the adhesion force between the connection members 200 and the redistribution lines 30 so that the connection members 200 are prevented or at least inhibited from being released from the redistribution lines 30.

In the present embodiment, the second ends of the respective redistribution lines 30 can extend to at least one of the plurality of side surfaces 5 of the semiconductor chip 10, and alternatively, the redistribution lines 30 can extend to as many as all of the side surfaces 5. For example, when the semiconductor chip 10 has four side surfaces 5, the second ends of the redistribution lines 30 can be flush with as few as one side surface 5, and as many as four of the side surfaces 5 of the semiconductor chip 10.

In the present embodiment, the redistribution lines 30 can have extension parts extending from the first surface 1 to the side surfaces 5. The extension parts increase the contact area between the redistribution lines 30 and the connection members 200 which will be described later in detail.

An adhesive member 350 is disposed over the insulation layer 9. The adhesive member 350 covers and electrically insulates the redistribution lines 30 placed on the insulation layer 9. The adhesive member 350 can comprise, for example, an adhesive substance or a double-sided adhesive tape.

Adhesive members 350 are respectively interposed between the first horizontal semiconductor chip module 100a and the second horizontal semiconductor chip module 100b and between the second horizontal semiconductor chip module 100b and the third horizontal semiconductor chip module 100c. Another adhesive member 350 is placed on the first surface 1 of the semiconductor chip 10 of the third horizontal semiconductor chip module 100c. The adhesive members 350 function to physically fasten the first through third horizontal semiconductor chip modules 100a, 100b, and 100c together.

The through-electrodes 20 pass through the first through third horizontal semiconductor chip modules 100a, 100b, and 100c. In the present embodiment, the through-electrodes 20 are electrically coupled with the respective redistribution lines 30 of the first through third horizontal semiconductor chip modules 100a, 100b, and 100c. In the present embodiment, the length of the through-electrodes 20 can correspond to the total thickness of the first through third horizontal semiconductor chip modules 100a, 100b, and 100c.

The connection members 210 and 220 for through-electrodes can be electrically connected with both ends of the through-electrodes 20, and additional semiconductor packages (not shown) can be electrically connected to the cube semiconductor package 300 using the connection members 210 and 220 for through-electrodes.

The connection members 200 are placed on the side surfaces 5 of the first through third horizontal semiconductor chip modules 100a, 100b, and 100c. The connection members 200 are electrically coupled with the second ends of the redistribution lines 30 which are substantially flush with the side surfaces 5 of the first through third horizontal semiconductor chip modules 100a, 100b, and 100c. In the present embodiment, the connection members 200 may be spherical in shape, however the present invention is not limited in this way, and other shapes are considered within the scope of the present invention. In the present embodiment, the connection members 200 can comprise, for example, solder balls which contain solder.

Meanwhile, the first through third vertical semiconductor chip modules 100d, 100e, and 100f can be placed on the connection members 200 which are placed on the side surfaces 5 of the first through third horizontal semiconductor chip modules 100a, 100b, and 100c.

According to an embodiment of the present invention depicted in FIG. 6, each of the first through third vertical semiconductor chip modules 100d, 100e, and 100f includes a semiconductor chip 12 having bonding pads (not shown) and through-electrodes 22. In the present embodiment, connection members 22a such as solder balls can be placed on those through-electrodes 22 among the through-electrodes 22 of the first through third vertical semiconductor chip modules 100d, 100e, and 100f, which are exposed to the outside. Other semiconductor packages can be connected to the connection members 22a.

In the present embodiment, the first and second vertical semiconductor chip modules 100d and 100e are connected to the connection members 200 which are placed on the side surfaces 5 of the first through third horizontal semiconductor chip modules 100a, 100b, and 100c.

In the present embodiment, the through-electrodes 22 of the first and second vertical semiconductor chip modules 100d and 100e are electrically coupled to the connection members 200 which are placed on the side surfaces 5 of the first through third horizontal semiconductor chip modules 100a, 100b, and 100c. In the present embodiment, the first and second vertical semiconductor chip modules 100d and 100e are shown having the same shape and the same size, although it is to be understood that the first and second vertical semiconductor chip modules 100d and 100e could alternatively include semiconductor chips of different shape and different size.

The third vertical semiconductor chip module 100f is placed on the second vertical semiconductor chip module 100e. The through-electrodes 22 of the third vertical semiconductor chip module 100f and the second vertical semiconductor chip module 100e are electrically coupled with each other by connection members 200 such as solder balls or the like.

In the present embodiment, gap-fill members 370 can be placed in the spaces defined between the side surfaces 5 of the first through third horizontal semiconductor chip modules 100a, 100b, and 100c and the first and second vertical semiconductor chip modules 100d and 100e. Another gap-fill member 370 can be placed in the space defined between the second vertical semiconductor chip module 100e and the third vertical semiconductor chip module 100f.

In the present embodiment, the first and second vertical semiconductor chip modules 100d and 100e can comprise, for example, data storage semiconductor chips for storing data, and the third vertical semiconductor chip module 100f can comprise a data processing semiconductor chip for processing data, although this is by way of example only, and the present invention is not limited in this way.

As is apparent from the above description, in the present invention, a plurality of semiconductor chips are stacked in a first direction (the vertical direction) so that a horizontal semiconductor chip module is formed, and a plurality of semiconductor chips are stacked on the sides of the stacked horizontal semiconductor chip module in a second direction (the horizontal direction) so that a semiconductor package can be manufactured in a cube type. As a consequence, in the present invention, data storage capacity and data processing speed can be increased.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A cube semiconductor package comprising:
a plurality semiconductor chip modules, each semiconductor chip module comprising:
a semiconductor chip comprising:
bonding pads disposed on a first surface;
through-electrodes passing through the first surface and second surface opposite the first surface of the semiconductor chip; and
redistribution lines disposed on at least one of the first and second surfaces, the redistribution lines being electrically coupled to the through-electrodes and to the bonding pads, wherein ends of the redistribution lines are flush with side surfaces that connect the first and second surfaces; and
connection members disposed on the side surfaces that are electrically coupled to the redistribution lines, wherein
some of the semiconductor chip modules are horizontally disposed upon each other and electrically coupled with each other via through-electrodes,
some of the semiconductor chip modules are vertically disposed along side surfaces of the horizontally disposed semiconductor chip modules,
wherein some of the semiconductor chip modules have shapes and sizes that are different from the other semiconductor chip modules in which this shape and size difference results in entrapping a gap deep within the cube semiconductor package when all of the semiconductor chip modules are disposed together; and a gap fill member filling in the gap, wherein some of the through-electrodes that pass through the horizontally disposed semiconductor chip modules also pass through the gap filled member and bypass at least one of the horizontally disposed semiconductor chip modules.

2. The cube semiconductor package according to claim 1, wherein the redistribution lines comprise extension parts extending from the first surface to at least one of the side surfaces.

3. The cube semiconductor package according to claim 1, wherein the connection members comprise conductive balls.

4. The cube semiconductor package according to claim 1, further comprising an adhesive member covering the redistribution lines and having openings defined therein for exposing the through-electrodes.

5. The cube semiconductor package according to claim 1, wherein the vertically disposed semiconductor chip modules are electrically coupled with the horizontally disposed semiconductor chip modules via connection members which are mutually coupled to redistribution lines of the horizontally stacked semiconductor chip modules and to through-electrodes of the vertically disposed semiconductor chip modules.

6. The cube semiconductor package according to claim 5, wherein the horizontally disposed semiconductor chip modules have different sizes and shapes, and wherein at least one of the side surfaces of the each of the horizontally disposed semiconductor chip modules are substantially flush with each other.

7. The cube semiconductor package according to claim 1, wherein the connection members comprise conductive balls which are coupled to ends of through-electrodes of at least one semiconductor chip modules.

8. The cube semiconductor package according to claim 1, wherein some of the semiconductor chip modules have substantially the same size and substantially the same shape.

9. The cube semiconductor package according to claim 1, wherein some of the vertically disposed semiconductor chip modules comprise one of a data storage semiconductor chip for storing data and a data processing semiconductor chip for processing data.

10. The cube semiconductor package according to claim 1, wherein some of the vertically disposed semiconductor chip modules are about the same size and shape of some of the horizontally disposed semiconductor chip modules.

11. The cube semiconductor package according to claim 1, wherein all of the vertically disposed semiconductor chip modules are sized differently than all of the horizontally disposed semiconductor chip modules.

12. The cube semiconductor package according to claim 1, wherein connection members of some of the horizontally disposed semiconductor chip modules are coupled to through-electrodes of some of the vertically disposed semiconductor chip modules.

13. The cube semiconductor package according to claim 1, wherein the redistribution lines are formed of a first metal having a first hardness and a first melting temperature, and the connection members are formed of a second metal having a second hardness and a second melting temperature, wherein the second hardness is less that the first hardness and the second melting temperature is lower than the first melting temperature.

14. A cube semiconductor package comprising:

a plurality semiconductor chip modules, each semiconductor chip module comprising:

a semiconductor chip comprising:

bonding pads disposed on a first surface;

through-electrodes passing through the first surface and second surface opposite the first surface of the semiconductor chip; and redistribution lines disposed on at least one of the first and second surfaces, the redistribution lines being electrically coupled to the through-electrodes and to the bonding pads, wherein ends of the redistribution lines are flush with side surfaces that connect the first and second surfaces; and connection members disposed on the side surfaces that are electrically coupled to the redistribution lines, wherein some of the semiconductor chip modules are horizontally disposed upon each other and electrically coupled with each other via through-electrodes, some of the semiconductor chip modules are vertically disposed along side surfaces of the horizontally disposed semiconductor chip modules, wherein the vertically disposed semiconductor chip modules are electrically coupled with the horizontally disposed semiconductor chip modules via connection members which are mutually coupled to redistribution lines of the horizontally stacked semiconductor chip modules and to through-electrodes of the vertically disposed semiconductor chip modules, wherein some of the semiconductor chip modules have shapes and sizes that are different from the other semiconductor chip modules in which this shape and size difference results in entrapping a gap deep within the cube semiconductor package when all of the semiconductor chip modules are disposed together, and a gap fill member filling in the gap, wherein some of the through-electrodes that pass through the horizontally disposed semiconductor chip modules also pass through the gap filled member and bypass at least one of the horizontally disposed semiconductor chip modules.

15. The cube semiconductor package according to claim 14, further comprising an adhesive member covering the redistribution lines and having openings defined therein for exposing the through-electrodes.

16. The cube semiconductor package according to claim 14, wherein the connection members comprise conductive balls which are coupled to ends of through-electrodes of at least one semiconductor chip modules.

17. The cube semiconductor package according to claim 14, wherein some of the semiconductor chip modules have substantially the same size and substantially the same shape.

18. The cube semiconductor package according to claim 14, wherein the redistribution lines are formed of a first metal having a first hardness and a first melting temperature, and the connection members are formed of a second metal having a second hardness and a second melting temperature, wherein the second hardness is less that the first hardness and the second melting temperature is lower than the first melting temperature.

19. A cube semiconductor package comprising:

a plurality semiconductor chip modules, each semiconductor chip module comprising:

a semiconductor chip comprising:

bonding pads disposed on a first surface;

through-electrodes passing through the first surface and second surface opposite the first surface of the semiconductor chip; and redistribution lines disposed on at least one of the first and second surfaces, the redistribution lines being electrically coupled to the through-electrodes and to the bonding pads, wherein ends of the redistribution lines are flush with side surfaces that connect the first and second surfaces; and connection members disposed on the side surfaces that are electrically coupled to the redistribution lines, wherein some of the semiconductor chip modules are horizontally disposed upon each other and electrically coupled with each other via through-electrodes, some of the semiconductor chip modules are vertically disposed along side surfaces of the horizontally disposed semiconductor chip modules, wherein some of the semiconductor chip modules have shapes and sizes that are different from the other semiconductor chip modules in which this shape and size difference results in entrapping a gap deep within the cube semiconductor package when all of the semiconductor chip modules are disposed together, a gap fill member filling in the gap,
wherein some of the through-electrodes that pass through the horizontally disposed semiconductor chip modules also pass through the gap filled member and bypass at least one of the horizontally disposed semiconductor chip modules; and an adhesive member covering the redistribution lines and having openings defined therein for exposing the through-electrodes.

20. The cube semiconductor package according to claim 19, wherein the vertically disposed semiconductor chip modules are electrically coupled with the horizontally disposed semiconductor chip modules via connection members which are mutually coupled to redistribution lines of the horizontally stacked semiconductor chip modules and to through-electrodes of the vertically disposed semiconductor chip modules.

* * * * *